(12) United States Patent
Anderson et al.

(10) Patent No.: US 7,888,750 B2
(45) Date of Patent: Feb. 15, 2011

(54) MULTI-FIN MULTI-GATE FIELD EFFECT TRANSISTOR WITH TAILORED DRIVE CURRENT

(75) Inventors: Brent A. Anderson, Jerihco, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 12/033,325

(22) Filed: Feb. 19, 2008

(65) Prior Publication Data

US 2009/0206374 A1 Aug. 20, 2009

(51) Int. Cl.
*H01L 29/78* (2006.01)
*H01L 29/10* (2006.01)
(52) U.S. Cl. ............... 257/401; 257/330; 257/E27.014
(58) Field of Classification Search ............... 257/330, 257/332, E27.014, 347, E21.409, E27.112, 257/401
See application file for complete search history.

(56) References Cited

U.S. PATENT DOCUMENTS

| 6,909,147 | B2 | 6/2005 | Aller et al. | |
| 7,094,650 | B2 * | 8/2006 | Chaudhary et al. | 438/283 |
| 7,098,502 | B2 * | 8/2006 | Mathew et al. | 257/308 |
| 7,560,785 | B2 * | 7/2009 | Yu et al. | 257/401 |
| 2002/0113277 | A1 * | 8/2002 | Mehrotra et al. | 257/401 |
| 2005/0215014 | A1 | 9/2005 | Ahn et al. | |
| 2009/0057780 | A1 * | 3/2009 | Wong et al. | 257/401 |

OTHER PUBLICATIONS

U.S. Appl. No. 11/556,844, filed Nov. 6, 2006, Schepis, et al., Pending Publication.

* cited by examiner

*Primary Examiner*—Eugene Lee
*Assistant Examiner*—David Spalla
(74) *Attorney, Agent, or Firm*—Gibb I.P. law Firm, LLC; Richard M. Kotulak, Esq.

(57) ABSTRACT

Disclosed are embodiments of an improved multi-gated field effect transistor (MUGFET) structure and method of forming the MUGFET structure so that it exhibits a more tailored drive current. Specifically, the MUGFET incorporates multiple semiconductor fins in order to increase effective channel width of the device and, thereby, to increase the drive current of the device. Additionally, the MUGFET incorporates a gate structure having different sections with different physical dimensions relative to the semiconductor fins in order to more finely tune device drive current (i.e., to achieve a specific drive current). Optionally, the MUGFET also incorporates semiconductor fins with differing widths in order to minimize leakage current caused by increases in drive current.

20 Claims, 13 Drawing Sheets

MULTI-FIN MULTI-GATE FIELD EFFECT TRANSISTOR WITH TAILORED DRIVE CURRENT

BACKGROUND

1. Cross-Reference to Related Applications

This application is related to the following co-pending application filed concurrently herewith by the same Applicants and assigned to the same Assignee: "A METHOD OF FORMING A MULTI-FIN MULTI-GATE FIELD EFFECT TRANSISTOR WITH TAILORED DRIVE CURRENT", Ser. No. 12/033,359. The complete disclosure of this co-pending application is incorporated herein by reference.

2. Field of the Invention

The embodiments of the invention generally relate to multi-fin, multi-gated field effect transistors (MUGFETS), and, more particularly, a multi-fin MUGFET structure and method in which drive current is tailored by varying the physical dimensions of the gate over one or more of the semiconductor fins.

This application is related to the following co-pending application filed concurrently herewith by the same Applicants and assigned to the same Assignee: "A METHOD OF FORMING A MULTI-FIN MULTI-GATE FIELD EFFECT TRANSISTOR WITH TAILORED DRIVE CURRENT", Ser. No. 12/033,359, the complete disclosure of which is incorporated herein by reference.

3. Description of the Related Art

Integrated circuit design decisions are often driven by device scalability and manufacturing efficiency. For example, size reduction of single-gate planar metal oxide semiconductor field effect transistors (MOSFETs) often results in reduced drive current because the width of the device is associated with the drive. In response, multi-gated non-planar field effect transistors (MUGFETs), such as double-gated FETs (e.g., fin-type FETs (finFETs)) or trigate FETs, were developed to provide scaled devices with faster drive currents and reduced short channel effects.

FinFETs are non-planar transistors in which a fully depleted channel region is formed in the center of a thin semiconductor fin with source and drain regions in the opposing ends of the fin adjacent to the channel region. Gates are formed each side of the thin fin in an area corresponding to the channel region. The effective fin width is determined by the fin height (e.g., short wide fins can cause partial depletion of a channel). Typically, for a double-gated fin-FET, a fin thickness of approximately one-fourth the length of the gate (or less) can ensure suppression of deleterious short-channel effects, such as variability in threshold voltage and excessive drain leakage currents.

Trigate MOSFETs have a similar structure to that of finFETs; however, the fin width and height are approximately the same so that gates can be formed on three sides of the channel, including the top surface and the opposing sidewalls. The height to width ratio is generally in the range of 3:2 to 2:3, so that the channel will generally remain fully depleted and the three-dimensional field effects of a trigate MOSFET will give greater drive current and improved short-channel characteristics over a planar transistor. As with finFETs, the effective channel width of a trigate MOSFET can be increased by using multiple fins. For a detail discussion of the structural differences between dual-gate finFETs and tri-gate MOSFETs see "Dual-gate (finFET) and Tri-Gate MOSFETs: Simulation and Design" by A Breed and K. P. Roenker, Semiconductor Device Research Symposium, 2003, pages 150-151, Dec. 2003 (incorporated herein by reference).

The effective channel width of MUGFETs (e.g., of finFETs or trigate FETs) and, thereby, device drive current can be increased by using multiple fins. However, for multi-fin MUGFETs quantization is a significant issue. That is, if device drive is not optimized, quantization can result in additional power and lower performance. Existing solutions include optimizing device drive by adjusting fin height, dielectric thickness and threshold voltage (Vt). However, tradeoffs are associated with each of these alternatives and these tradeoffs typically include additional processing which adds to the wafer cost and development complexity.

SUMMARY

In view of the foregoing disclosed herein are embodiments of an improved multi-gated field effect transistor (MUGFET) structure and method of forming the MUGFET structure so that it exhibits a more tailored drive current. Specifically, the MUGFET incorporates multiple semiconductor fins in order to increase effective channel width of the device and, thereby, to increase the drive current of the device. Additionally, the MUGFET incorporates a gate structure having different sections with different physical dimensions relative to the semiconductor fins in order to more finely tune device drive current (i.e., to achieve a specific drive current). Optionally, the MUGFET also incorporates semiconductor fins with differing widths in order to minimize leakage current caused by increases in drive current.

More particularly, embodiments of a field effect transistor structure of the present invention comprise a substrate, source and drain regions opposite each other on the substrate, semiconductor fins extending from the source region to the drain region and a gate traversing the semiconductor fins. The semiconductor fins can be approximately parallel to each other and can have approximately equal heights relative to the substrate. The number of semiconductor fins can be predetermined based on the desired effective channel width. Those skilled in the art will recognize that additional fins can be used to provide a greater effective channel width and, thereby, to provide a greater drive current. That is, each additional semiconductor fin will increase the effective channel width by some incremental value and, thereby, increase the drive current by some incremental value. However, for purposes of this disclosure, the field effect transistor embodiments of the present invention are illustrated herein as having three semiconductor fins and described herein as comprising at least one first semiconductor fin and at least one second semiconductor fin adjacent to that at least one first semiconductor fin.

The gate can comprise a first section adjacent the first semiconductor fin(s) and a second section adjacent the second semiconductor fin(s). Specifically, the first section can be positioned on the first top surface and first opposing sidewalls of each first semiconductor fin. Similarly, the second section can be positioned on the second top surface and second opposing sidewalls of each second semiconductor fin. However, the physical dimensions of the first and second gate sections relative to the first and second semiconductor fins, respectively, are different. That is, the first and second gate sections have different physical dimensions such that a first surface area of the first top surface and the first opposing sidewalls of each first semiconductor fin covered by the first gate section is different than a second surface area of the second top surface and the second opposing sidewalls of each second semiconductor fin covered by the second gate section. The different physical dimensions of the two sections are predetermined in order to tailor the device drive current. That is, they are predetermined in order to make fine adjustments to drive current and, thereby, to achieve a more precisely controlled drive current than was achievable previously, where the drive current adjustment was made by adding or removing entire semiconductor fins.

For example, reducing the physical dimensions of the second section of the gate relative to each second semiconductor fin, as compared to the physical dimensions of the first section relative to each first semiconductor fin, can result in an increase in device drive current. Contrarily, increasing the physical dimensions of the second section of the gate relative to each second semiconductor fin as compared to the physical dimensions of the first section relative to each first semiconductor fin can result in a decrease in device drive current. The physical dimensions of the gate sections can differ in a variety of different ways, such as, in length and/or in the distance each gate section extends along the fin sidewalls towards the substrate.

In one embodiment of the transistor structure, the first section can have a first length and the second section can have a second length that is different from the first length. The different first and second lengths can be predetermined in order to achieve a specific drive current. For example, the second length can be either shorter than the first length in order to increase drive current or longer than the first length to decrease drive current.

In another embodiment of the transistor structure, the first section can extend a first distance along the first opposing sidewalls of each first semiconductor fin. This first distance can be measured from a first top surface of a first semiconductor fin towards the substrate. The second section can extend a second distance, different from the first distance, along the second opposing sidewalls of each second semiconductor fin. This second distance can be measured from a second top surface of a second semiconductor fin towards substrate. The different first and second distances can be predetermined in order to achieve a specific drive current. For example, the second distance can be either shorter than the first distance in order to increase drive current or longer than the first distance to decrease drive current.

The different distances that the two sections extend along the opposing sidewalls of the semiconductor fins can be achieved, for example, if the field effect transistor also comprises first and second trench isolation regions with different predetermined thicknesses (i.e., a first thickness and a second thickness) adjacent to the opposing sidewalls of the first and second semiconductor fins, respectively.

For example, the first distance can be greater than the second distance. To accomplish this, a first trench isolation region can be positioned adjacent to the first opposing sidewalls of each first semiconductor fin between the substrate and the first section of the gate. This first trench isolation region can have a predetermined first thickness. A second trench isolation region can be positioned adjacent to the second opposing sidewalls of each second semiconductor fin between the substrate and the second section of the gate. This second trench isolation region can have a predetermined second thickness that is greater than the predetermined first thickness of the first trench isolation region. Thus, when the gate is subsequently formed above the first and second trench isolation regions, the distance that the second section of the gate extends along the sidewalls of each second semiconductor fin towards the substrate (i.e., the second distance) will be less than the distance that the first section of the gate extends along the sidewalls of each first semiconductor fin towards the substrate (i.e., the first distance).

Alternatively, the first distance can be less than the second distance. To accomplish this, a first trench isolation region can be positioned adjacent to the first opposing sidewalls of each semiconductor fin between the substrate and the first section of the gate. This first trench isolation region can have a predetermined first thickness. A second trench isolation region can be positioned adjacent to the second opposing sidewalls of each second semiconductor fin between the substrate and the second section of the gate. This second trench isolation region can have a predetermined second thickness that is less than the predetermined first thickness of the first trench isolation region. Thus, when the gate is subsequently formed above the first and second trench isolation regions, the distance that the second section of the gate extends along the sidewalls of each second semiconductor fin towards the substrate (i.e., the second distance) will be greater than the distance that the first section of the gate extends along the sidewalls of each first semiconductor fin towards the substrate (i.e., the first distance).

In yet another embodiment of the transistor structure, both the lengths of the first and second gate sections (i.e., the first and second lengths) and the distances that they extend along their respective semiconductor fin sidewalls towards the substrate (i.e., the first and second distances) can differ and can be predetermined in order to achieve a specific drive current.

Those skilled in the art will recognize that the drive current and leakage current of a field effect transistor are interdependent. That is, an increase in drive current will typically result in a corresponding increase in leakage current. Consequently, if the physical dimensions of the second section relative to each second semiconductor fin are reduced as compared to the physical dimensions of the first section relative to each first semiconductor fin in order to finely adjust (i.e., increase drive current), the width of each second semiconductor fin (i.e., second width) can also be reduced as compared to the width of each first semiconductor fin (i.e., first width) in order to minimize (i.e., limit or avoid altogether) any corresponding increase in leakage current.

Embodiments of the method of forming the field effect transistor structure, described above, can comprise first providing a substrate. Source and drain regions can be formed opposite each other on the substrate with semiconductor fins extending from the source region to the drain region. The semiconductor fins can be formed such that they are approximately parallel to each other and such that they have approximately equal heights relative to the substrate. The number of semiconductor fins can be predetermined based on the desired effective channel width. Those skilled in the art will recognize that additional semiconductor fins can be used to provide a greater effective channel width and, thereby, to provide a greater drive current. That is, each additional semiconductor fin will increase the effective channel width by some incremental value and, thereby, increase the drive current by some incremental value. However, for purposes of this disclosure, the field effect transistor of the present invention is illustrated herein as being formed with three semiconductor fins and described herein as being formed with at least one first semiconductor fin and at least one second semiconductor fin adjacent to the at least one first semiconductor fin.

After the semiconductor fins and source and drain regions are formed, a gate can be formed that traverses all of the semiconductor fins. The process of forming the gate can comprise forming the gate such that a first gate section is formed on the first top surface and first opposing sidewalls of each first semiconductor fin and a second section is formed on the second top surface and second opposing sidewalls of each second semiconductor fin. However, the gate is formed such that the first and second gate sections have different physical dimensions and, due to these different physical dimensions, a first surface area of the first top surface and the first opposing sidewalls of each first semiconductor fin covered by the first gate section is different than a second surface area of the second top surface and the second opposing sidewalls of each second semiconductor fin covered by the second gate section. The different physical dimensions of the two sections are predetermined in order to tailor the device drive current (i.e., in order to make fine adjustments to drive current and, thereby, to achieve a specific drive current).

For example, reducing the physical dimensions of the second section of the gate relative to each second semiconductor fin as compared to the physical dimensions of the first section relative to each first semiconductor fin can result in an increase in device drive current. Contrarily, increasing the physical dimensions of the second section of the gate relative to each second semiconductor fin as compared to the physical dimensions of the first section relative to each first semiconductor fin can result in a decrease in device drive current. The physical dimensions of the gate sections can differ in a variety of different ways, such as, in length and/or in the distance each gate section extends along the fin sidewalls towards the substrate.

In one embodiment of the method, the first and second lengths of the first and second sections, respectively, can be predetermined in order to achieve a specific drive current. For example, the second length can be either shorter than the first length in order to increase drive current or longer than the first length in order to decrease drive current. Then, the first section can be formed such that it has the predetermined first length relative to each first semiconductor fin and the second section can be formed such that it has the different predetermined second length relative to each second semiconductor fin.

In another embodiment of the method, first and second distances, which the first and second sections of the gate will respectively extend along the opposing sidewalls of the fins towards the substrate, are predetermined in order to achieve a specific drive current. For example, the second distance can be either shorter than the first distance in order to increase drive current or longer than the first distance in order to decrease drive current. Then, the first section can be formed such that it extends along the sidewalls of each first semiconductor fin toward the substrate the predetermined first distance and the second section can be formed such that it extends along the sidewalls of each second semiconductor fin the different predetermined second distance. In order to form such first and second sections, trench isolation regions (i.e., first and second trench isolation regions) with different predetermined thicknesses (i.e., different first and second thicknesses) can be formed adjacent to the opposing sidewalls of the first and second semiconductor fins, prior to forming the gate.

In yet another embodiment of the method, the different lengths (i.e., the first and second lengths, as defined above) and the different distances (i.e., the first and second distances, as defined above) can be predetermined. Then, the first and second sections can be formed with the different predetermined physical dimensions, as discussed above.

Those skilled in the art will recognize that the drive current and leakage current of a field effect transistor are interdependent. That is, an increase in drive current will typically result in a corresponding increase in leakage current. Consequently, if the physical dimensions of the second section relative to each second semiconductor fin are to be reduced as compared to the physical dimensions of the first section relative to each first semiconductor fin in order increase drive current, the semiconductor fins can be formed such that the width of each second semiconductor fin (i.e., second width) is also reduced relative to the width of each first semiconductor fin (i.e., first width) in order to minimize (i.e., limit or avoid altogether) any corresponding increase in leakage current.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
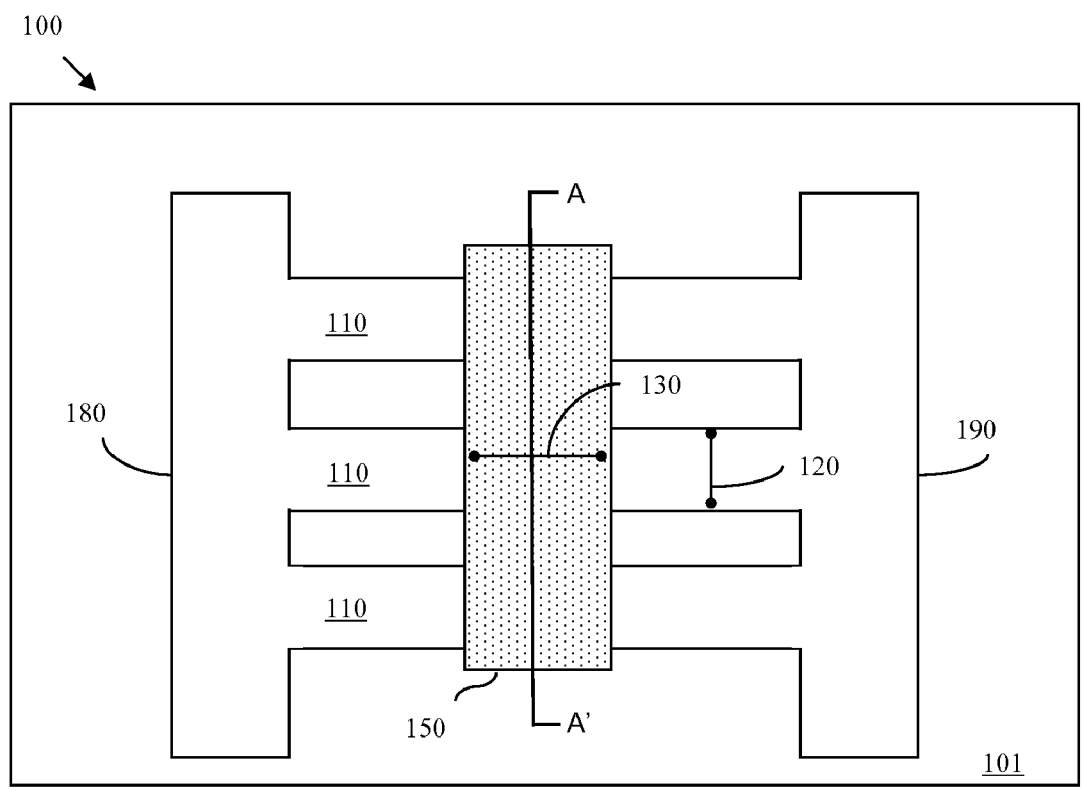
FIG. 1 is top view diagram illustrating a multi-fin, multi-gated field effect transistor (MUGFET)

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As discussed above, multi-gated non-planar field effect transistors (MUGFETs), such as fin-type FETs (finFETs)) or trigate FETs, were developed to provide scaled devices with faster drive currents and reduced short channel effects. Additionally, by incorporating multiple semiconductor fins into such MUGFET structures, the effective channel width and, thereby, the device drive current can further be increased.

Figure 2:
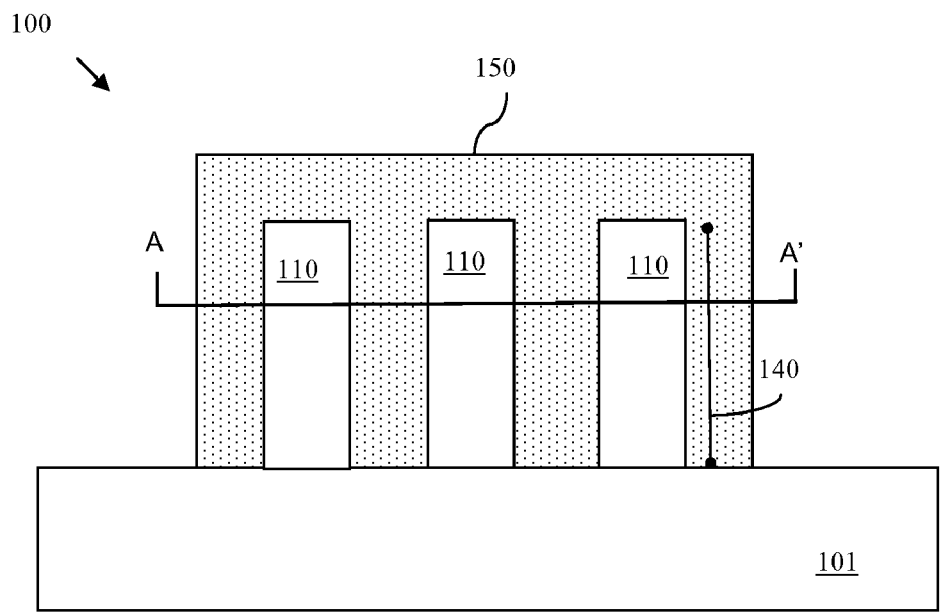
FIG. 2 is a cross-section view diagram of the MUGFET of FIG. 1.

For example, FIGS. 1 and 2 are top view and cross section diagrams, respectively, illustrating a MUGFET 100 (e.g., either a finFET or trigate FET) having multiple semiconductor fins 110. Specifically, the MUGFET 100 comprises a substrate 101, source and drain regions 180-190 opposite each other on the substrate 101, semiconductor fins 110 extending from the source region 180 to the drain region 190 and a gate 150 with a constant width 130 traversing the semiconductor fins 110. The semiconductor fins 110 are approximately parallel to each other and are equal in width 120 and height 140. The number of semiconductor fins is predetermined based on the desired effective channel width because each additional semiconductor fin increases the effective channel width by some incremental value and, thereby, increases the drive current by some incremental value. However, for conventional multi-fin MUGFETs, such as the MUGFET 100 of FIG. 1, quantization is a significant issue. That is, if device drive is not optimized, quantization can result in additional power and lower performance. Existing solutions include optimizing device drive by adjusting fin height, dielectric thickness and threshold voltage (Vt). However, tradeoffs are associated with each of these alternatives and these tradeoffs typically include additional processing which adds to the wafer cost and development complexity.

In view of the foregoing disclosed herein are embodiments of an improved multi-gated field effect transistor (MUGFET) structure and method of forming the MUGFET structure so that it exhibits a more tailored drive current. Specifically, the MUGFET incorporates multiple semiconductor fins in order to increase effective channel width of the device and, thereby, to increase the drive current of the device. Additionally, the MUGFET incorporates a gate structure having different sections with different physical dimensions relative to the semiconductor fins in order to more finely tune device drive current (i.e., to achieve a specific drive current). Optionally, the MUGFET also incorporates semiconductor fins with differing widths in order to minimize leakage current caused by increases in drive current.

More particularly, referring to FIGS. 2-9 each of the embodiments of the field effect transistor structure 200 of the present invention can comprise a substrate 201. The top surface of the substrate 201 can comprise an isolation layer. For example, the top surface of the substrate can comprise a buried oxide layer of a silicon-on-insulator (SOI) wafer. Alternatively, the top surface of the substrate 201 can comprise a silicon dioxide layer, a doped silicon layer, a silicon germanium layer, etc., on a bulk semiconductor wafer.

Each of the embodiments of the field effect transistor structure 200 can further comprise semiconductor bodies (i.e., source and drain regions 280-290) opposite each other on the substrate 201. As illustrated, the source and drain regions 280-290 can be positioned approximately parallel to each other on the substrate 201. Alternatively, the source and drain regions 280-290 can be angled with respect to each other. The source and drain regions 280-290 can further be appropriately doped with N-type or P-type dopants. That is, for an N-type FET (NFET) the source and drain regions 280-290 can be implanted with, for example, phosphorus (P), antimony (Sb) or arsenic (As). Alternatively, for a P-type FET (PFET) the source and drain regions 280-290 can be implanted with, for example, boron (B).

Each of the embodiments of the field effect transistor structure 200 can further comprise a plurality of semiconductor fins 211-212 extending from the source region 280 to the drain region 290. As illustrated, the semiconductor fins 211-212 can be approximately parallel to each other and approximately perpendicular to the source and drain regions 280-290. Alternatively, the semiconductor fins 211-212 may be angled with respect to each other and/or with respect to the source and drain regions 280-290.

Generally, the height and width of the semiconductor fins 211-212 can be predetermined, depending upon whether the field effect transistor 200 is a multi-fin finFET or a multi-fin trigate FET. For example, for a multi-fin trigate FET, the semiconductor fins 211-212 can each have a predetermined height to width ratio that ranges between approximately 3:2 and 2:3. Whereas, for a multi-fin finFET, the semiconductor fins 211-212 can each have a predetermined height to width ratio that is approximately 4:1 or more. The first and semiconductor fins 211-212 can have approximately equal heights 270 relative to the substrate 201 as well as approximately equal widths 220 (as illustrated in FIGS. 3-6. However, as discussed in detail below and illustrated in FIGS. 7 and 8, it may be advantageous to provide form the first and second semiconductor fins 211-212 with different first and second widths 221-222, respectively. Note a pitch between the first and second semiconductor fins can be consistent.

Each of the semiconductor fins 211-212 can have a designated channel region and source/drain extension regions on either side of the channel region. That is, the source/drain extension regions can extend outward from the channel region to the source/drain regions 280-290. The source/drain extension regions and channel region of each fin 211-212 can be appropriately doped, depending upon whether the field effect transistor 200 is an NFET or a PFET.

The number of semiconductor fins 211-212 in the field effect transistor 200 can be predetermined based on the desired effective channel width. Those skilled in the art will recognize that additional semiconductor fins can be used to provide a greater effective channel width and, thereby, to provide a greater drive current. That is, each additional semiconductor fin will increase the effective channel width by some incremental value and, thereby, increase the drive current by some incremental value. However, for purposes of this disclosure, the embodiments of the field effect transistor 200 of the present invention are illustrated herein with three semiconductor fins and described herein as comprising at least one first semiconductor fin 211 and at least one second semiconductor fin 212 adjacent to that at least one first semiconductor fin 211.

Each of the embodiments of the field effect transistor structure 200 can further comprise a gate 250 traversing all of the semiconductor fins 211-212 and, more specifically, traversing each fin 211-212 such that it covers the top surface and at least a portion of the opposing sidewalls of each of the semiconductor fins 211-212 over their designated channel regions. As illustrated, the transistor 200 may be symmetric. That is, the gate 250 and, thus, the designated channel region in each fin below the gate 250 may be centered between the source and drain regions 280-290. Alternatively, the transistor 200 may be asymmetric with the gate 250 and channel regions in the fin below the gate 250 off-center (e.g., closer to the source region 280 in order to minimize resistance between the source region 280 and gate 250 and further to minimize capacitance between the gate 250 and drain region 290).

As with conventional gate structures for MUGFETs, the gate 250 can comprise a thin gate dielectric layer (e.g., a thin silicon dioxide ($SiO_2$) layer or any other suitable gate dielectric layer) on the top surface and opposing sidewalls of the semiconductor fins 211-212 and a gate conductor layer (e.g., doped gate polysilicon layer) on the gate dielectric layer.

In each of the embodiments of the field effect transistor 200, the gate 250 can further comprise a first section 251 adjacent to each first semiconductor fin 211 and a second section 252 adjacent to each second semiconductor fin 212. Specifically, the first section 251 can be positioned on the first top surface and first opposing sidewalls of each first semiconductor fin 211. Similarly, the second section 252 can be positioned on the second top surface and second opposing sidewalls of each second semiconductor fin 212. However, the physical dimensions of the first and second gate sections 251-252 relative to the first and second semiconductor fins 211-212, respectively, are different. That is, the first and second gate sections 251-252 have different physical dimensions such that a first surface area of the first top surface and the first opposing sidewalls of each first semiconductor fin 211 covered by the first gate section 251 is different than a second surface area of the second top surface and the second opposing sidewalls of each second semiconductor fin 212 covered by the second gate section 252. The different physical dimensions of the two sections 251-252 are predetermined in order to tailor the device drive current. That is, they are predetermined in order to make fine adjustments to drive current and, thereby, to achieve a more precisely controlled drive current than was achievable previously, where the drive current adjustment was made by adding or removing entire semiconductor fins.

For example, reducing the physical dimensions of the second section 252 of the gate 250 relative to each second semiconductor fin 212 as compared to the physical dimensions of the first section 251 relative to each first semiconductor fin 211 can result in an increase in the drive current of the transistor 200. For example, if the second section 252 is positioned adjacent to only one second semiconductor fin 212, the physical dimensions of second section 252 may be reduced in order to increase the drive current of the transistor 200 by an intermediate value less than the incremental value associated with the addition of a semiconductor fin into the FET structure (as illustrated in FIGS. 3, 5, 7 and 8). Contrarily, increasing the physical dimensions of the second section 252 of the gate 250 relative to each second semiconductor fin 212 as compared to the physical dimensions of the first section 251 relative to each first semiconductor fin 211 can result in a decrease in the drive current of the transistor 200. For example, if the second section 252 is positioned adjacent to only one second semiconductor fin 212, the physical dimensions of the second section may be increased in order to decrease the drive current of the transistor 200 by an intermediate value less than the incremental value associated with removing a semiconductor fin from the FET structure as illustrated in FIGS. 4 and 6). The physical dimensions of the gate sections 251-252 can differ in a variety of different ways, such as, in length and/or in the distance each gate section extends along the fin sidewalls towards the substrate.

Figure 3:
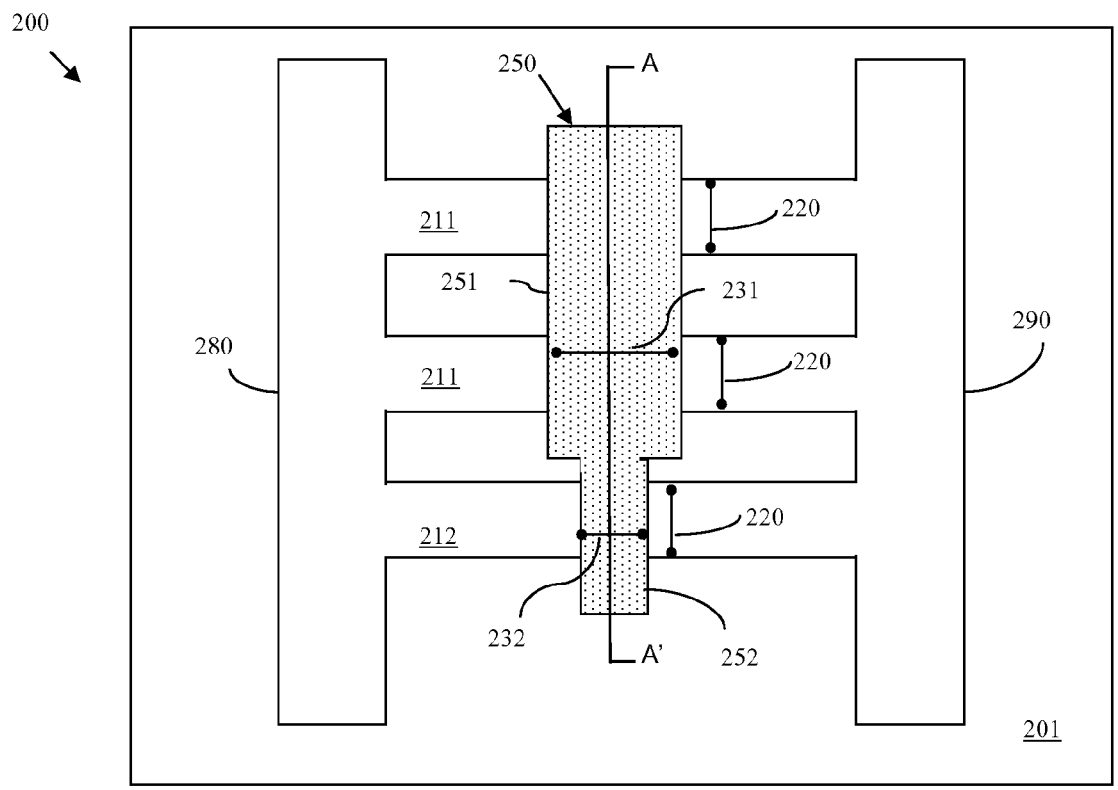
FIG. 3 is a top view diagram illustrating an embodiment of a multi-fin MUGET of the present invention.
Figure 4:
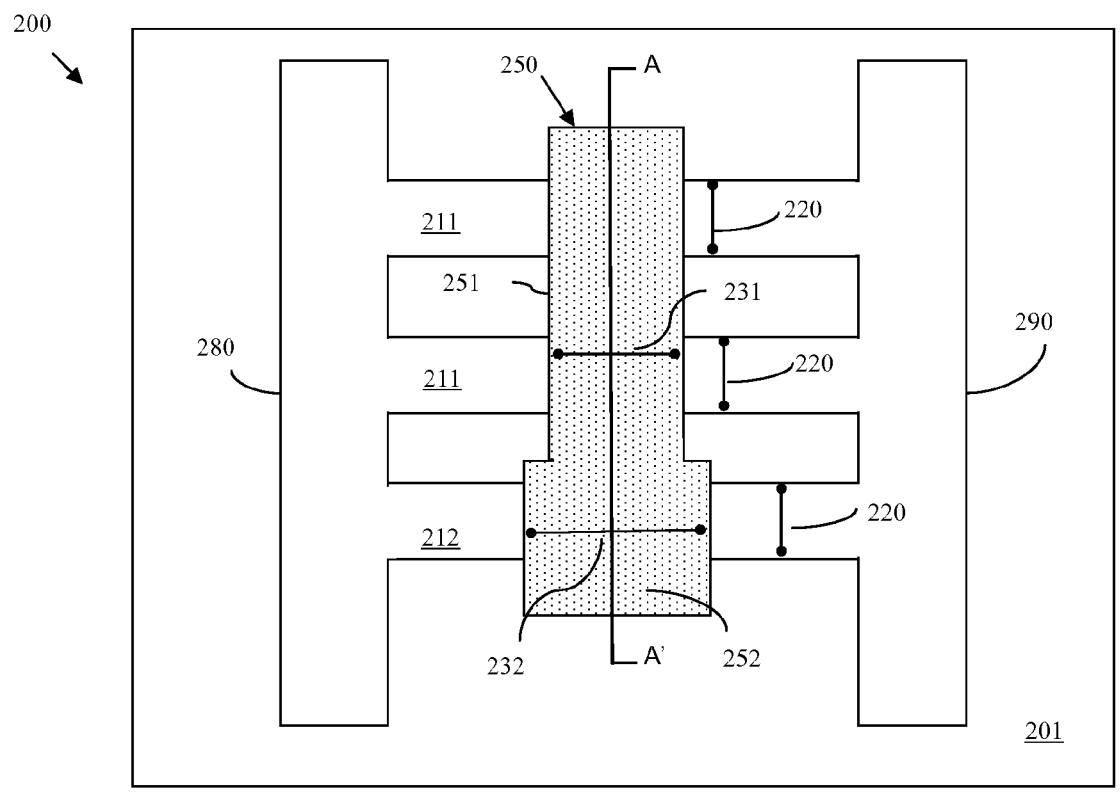
FIG. 4 is a top view diagram illustrating another embodiment of a multi-fin MUGET of the present invention.

More specifically, referring to FIGS. 3 and 4, in one embodiment of the transistor structure 200, the first section 251 can have a first length 231, as measured parallel to a first semiconductor fin 211, and the second section 252 can have a second length 232, as measured parallel to the second semiconductor fin 212. The length 232 of the second section 252 of the gate 250 can be different from the length 231 of the first section 251 of the gate 250. The first and second lengths 231-232 can be predetermined in order to achieve a specific (i.e., a tailored) drive current.

For example, as illustrated in FIG. 3, the length 232 of the second section 252 can be less than the length 231 of the first section 251. Reducing the length 232 of the second section 252 of the gate 250 as compared to the length 231 of the first section 251 can result in an increase in drive current of the transistor 200 (e.g., by an intermediate value less than the incremental value associated with the addition of a whole semiconductor fin). Alternatively, as illustrated in FIG. 4, the length 232 of the second section 252 can be greater than the length 231 of the first section 251. Increasing the length 232 of the second section 252 of the gate 250 as compared to the length 231 of the first section 251 can result in a decrease in the drive current of the transistor 200 (e.g., by an intermediate value less than the incremental value associated with removing a semiconductor fin).

Figure 5:
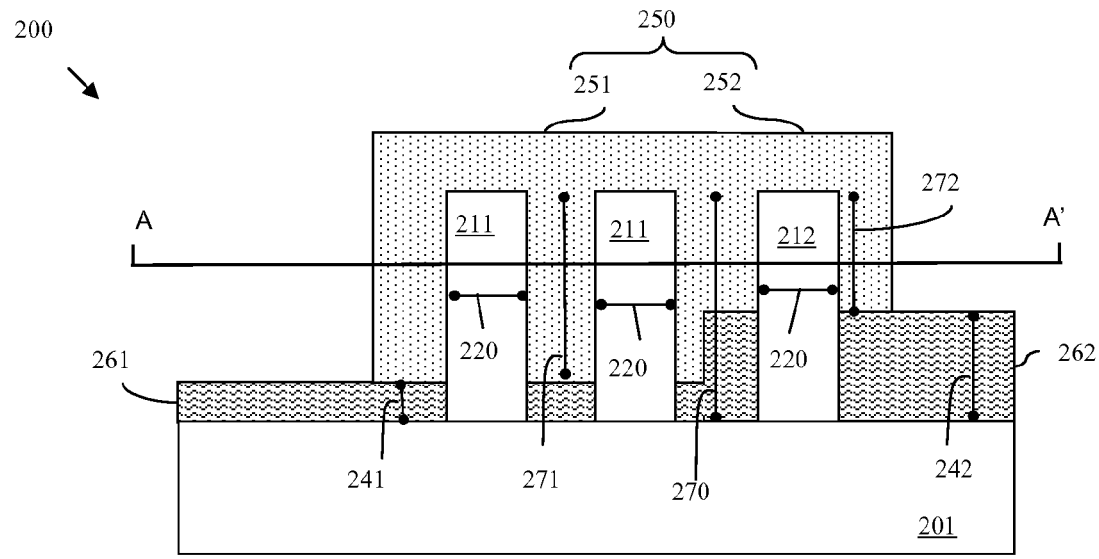
FIG. 5 is a cross-section view diagram illustrating another embodiment of a multi-fin MUGFET of the present invention.
Figure 6:
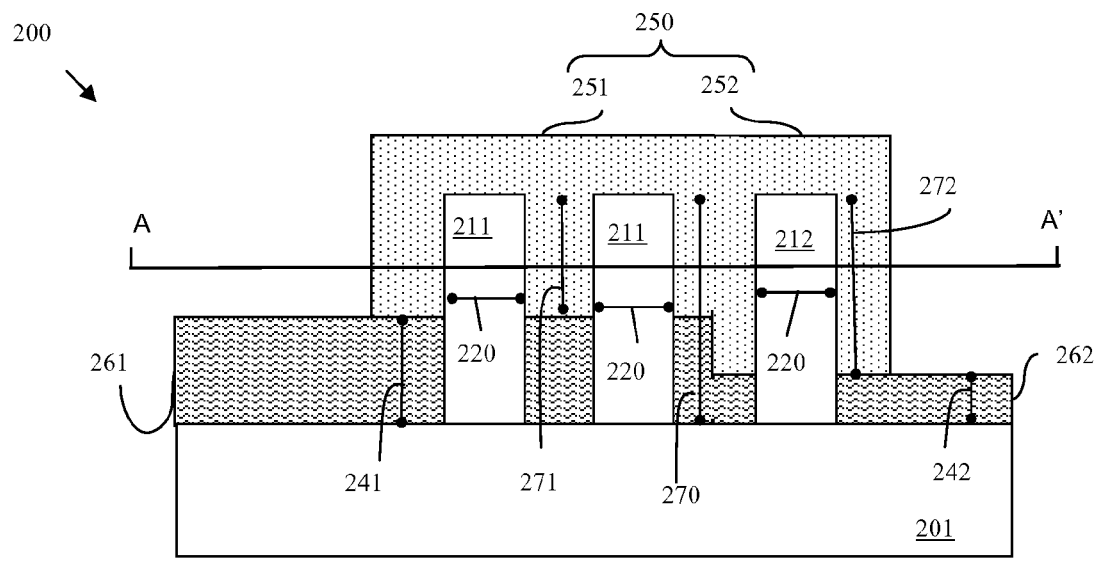
FIG. 6 is a cross-section view diagram illustrating another embodiment of a multi-fin MUGFET of the present invention.

Referring to FIGS. 5 and 6, in another embodiment of the transistor structure 200, the first section 251 can extend a first distance 271 along the first opposing sidewalls of the each first semiconductor fin 211. This first distance 271 can be measured from a first top surface of a first semiconductor fin 211 towards the substrate 201. The second section 252 can extend a second distance 272, different from the first distance 271, along the second opposing sidewalls of each second semiconductor fin 212. This second distance 272 can be measured from a second top surface of a second semiconductor fin 212 towards the substrate. The different first and second distances 271-272 can be predetermined in order to achieve a specific drive current. For example, the second distance 272 can be either shorter than the first distance 271 in order to increase drive current or longer than the first distance 271 to decrease drive current.

The different distances 271-272 that the two sections 251-252 extend along the opposing sidewalls of the semiconductor fins 211-212 can be achieved, for example, if the field effect transistor 200 also comprises first and second trench isolation regions 261-262 with different predetermined thicknesses (i.e., a first thickness 241 and a second thickness 242) adjacent to the opposing sidewalls of the first and second semiconductor fins 211-212, respectively.

For example, as illustrated in FIG. 5, the first distance 271 can be greater than the second distance 272. To accomplish this, a first trench isolation region 261 can be positioned adjacent to the first opposing sidewalls of each first semiconductor fin 211 between the substrate 201 and the first section 251 of the gate 250. This first trench isolation region 261 can have a first thickness 241. A second trench isolation region 262 can be positioned adjacent to the second opposing sidewalls of each second semiconductor fin 212 between the substrate 201 and the second section 252 of the gate 250. This second trench isolation region 262 can have a second thickness 242 that is greater than the first thickness 241 of the first trench isolation region 261. Thus, when the gate 250 is subsequently formed above the first and second trench isolation regions 261-262, the distance that the second section 252 extends along the second semiconductor fin sidewalls towards the substrate 201 (i.e., the second distance 272) will be less than the distance that the first section 251 extends along the first semiconductor fin sidewalls towards the substrate 201 (i.e., the first distance 272). As mentioned above, reducing the second distance 272 that the second section 251 extends along the sidewalls of each second semiconductor fin 212 as compared to the first distance 271 that the first section 251 extends along the sidewalls of each first semiconductor fin 211 can result in an increase in the drive current of the transistor 200 (e.g., by an intermediate value less than the incremental value associated with the addition of a semiconductor fin).

Alternatively, as illustrated in FIG. 6, the first distance 271 can be less than the second distance 272. To accomplish this, a first trench isolation region 261 can be positioned adjacent to the first opposing sidewalls of each first semiconductor fin 211 between the substrate 201 and the first section 251 of the gate 250. This first trench isolation region 261 can have a first thickness 241. A second trench isolation region 262 can be positioned adjacent to the second opposing sidewalls of each second semiconductor fin 212 between the substrate 201 and the second section 252 of the gate 250. This second trench isolation region 262 can have a second thickness 242 that is less than the first thickness 241 of the first trench isolation region 261. Thus, when the gate 250 is subsequently formed above the first and second trench isolation regions 261-262, the distance that the second section 252 extends along the second semiconductor fin sidewalls towards the substrate 201 (i.e., the second distance 272) will be greater than the distance that the first section 251 extends along the first semiconductor fin sidewalls towards the substrate 201 (i.e., the first distance 272). As mentioned above, increasing the second distance 272 that the second section 251 extends along the sidewalls of each second semiconductor fin 212 as compared to the first distance 271 that the first section 251 extends along the sidewalls of each first semiconductor fin 211 can result in a decrease in the drive current of the transistor 200 (e.g., by an intermediate value less than the incremental value associated with the addition of a semiconductor fin).

In yet another embodiment of the transistor structure 200, the features illustrated in FIG. 3 or 4 and the features illustrated in FIG. 5 or 6 can be combined. That is, both the first and second lengths 231-232 of the first and second gate sections 251-252 and the first and second distances 271-272 that they extend along their respective semiconductor fin sidewalls towards the substrate 201 can differ by predetermined amounts in order to achieve a specific drive current.

Figure 7:
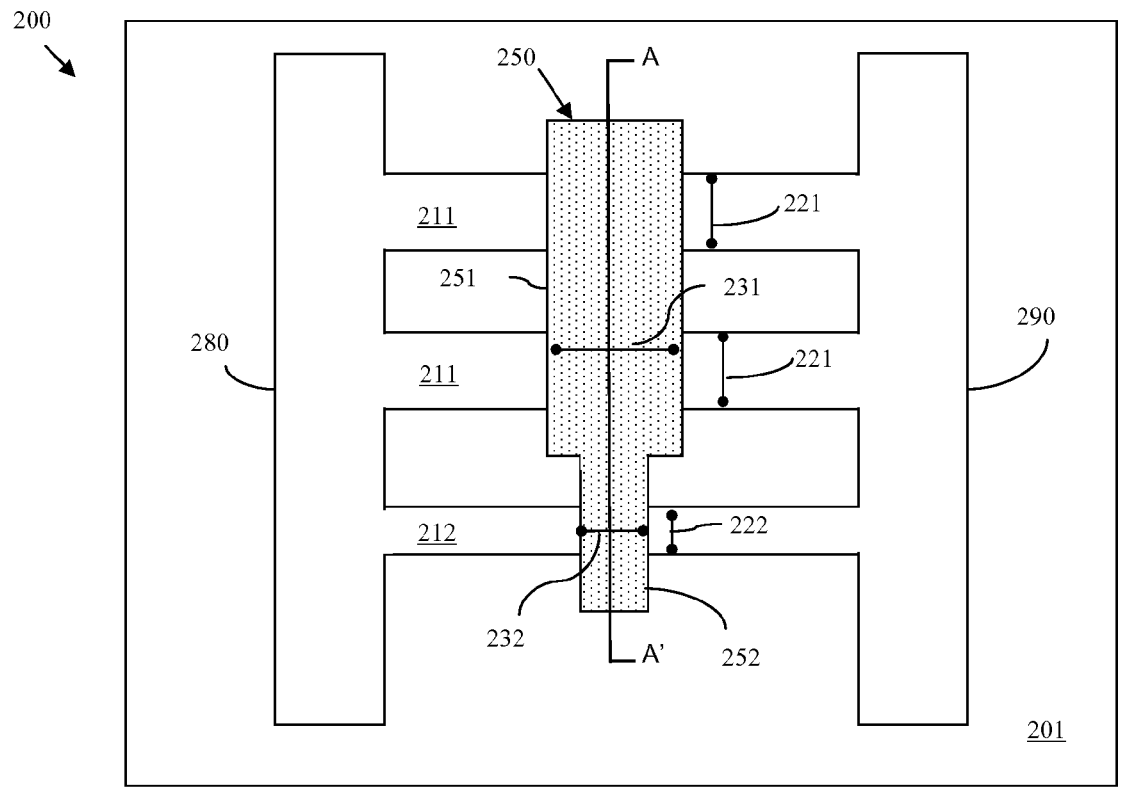
FIG. 7 is a top view diagram illustrating an additional feature (i.e., different semiconductor fin widths) that can be incorporated into any one of the embodiments illustrated in FIGS. 3-6.
Figure 8:
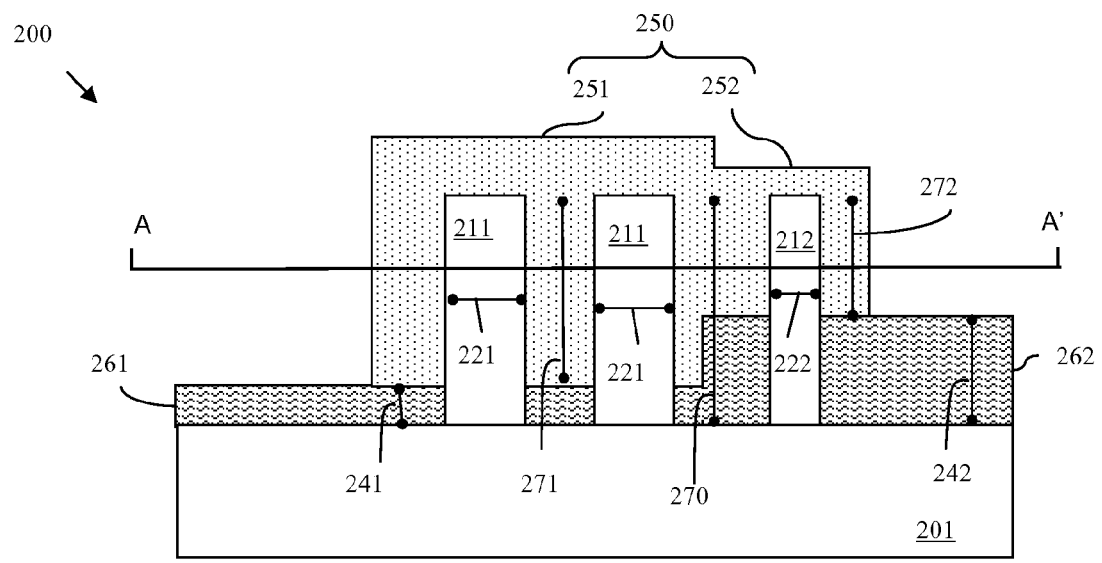
FIG. 8 is a cross-section view diagram illustrating the same additional feature of FIG. 7 that can be incorporated into any one of the embodiments illustrated in FIGS. 3-6.

Those skilled in the art will recognize that the drive current and leakage current of a field effect transistor 200 are interdependent. That is, an increase in drive current will typically result in a corresponding increase in leakage current. Consequently, if the physical dimensions of the second section 252 relative to each second semiconductor fin 212 are reduced as compared to the physical dimensions of the first section 251 relative to each first semiconductor fin 211, then the width 222 of each second semiconductor fin 212 can also be reduced relative to the width 221 of each first semiconductor fin 211 in order to minimize (i.e., limit or avoid altogether) any corresponding increase in leakage current. For example, if the second length 232 of the second section 252 is less than the first length 231 of the first section 251 (as illustrated in FIG. 7) and/or the distance 272 that the second section 252 extends along the sidewalls of each second semiconductor fin 212 towards the substrate 201 is less that the distance 271 that the first section 251 extends along the sidewalls of each first semiconductor fin 211 towards the substrate 201 (as illustrated in FIG. 8), then each second semiconductor fin 212 can further have a second width 222 that is less than the first width 221 of each first semiconductor fin 211. The different first and second widths 221-222 can be predetermined in order to minimize leakage current and, more specifically, to minimize any leakage current associated with the increases in drive current resulting from the smaller physical dimensions of the second section 252.

Figure 9:
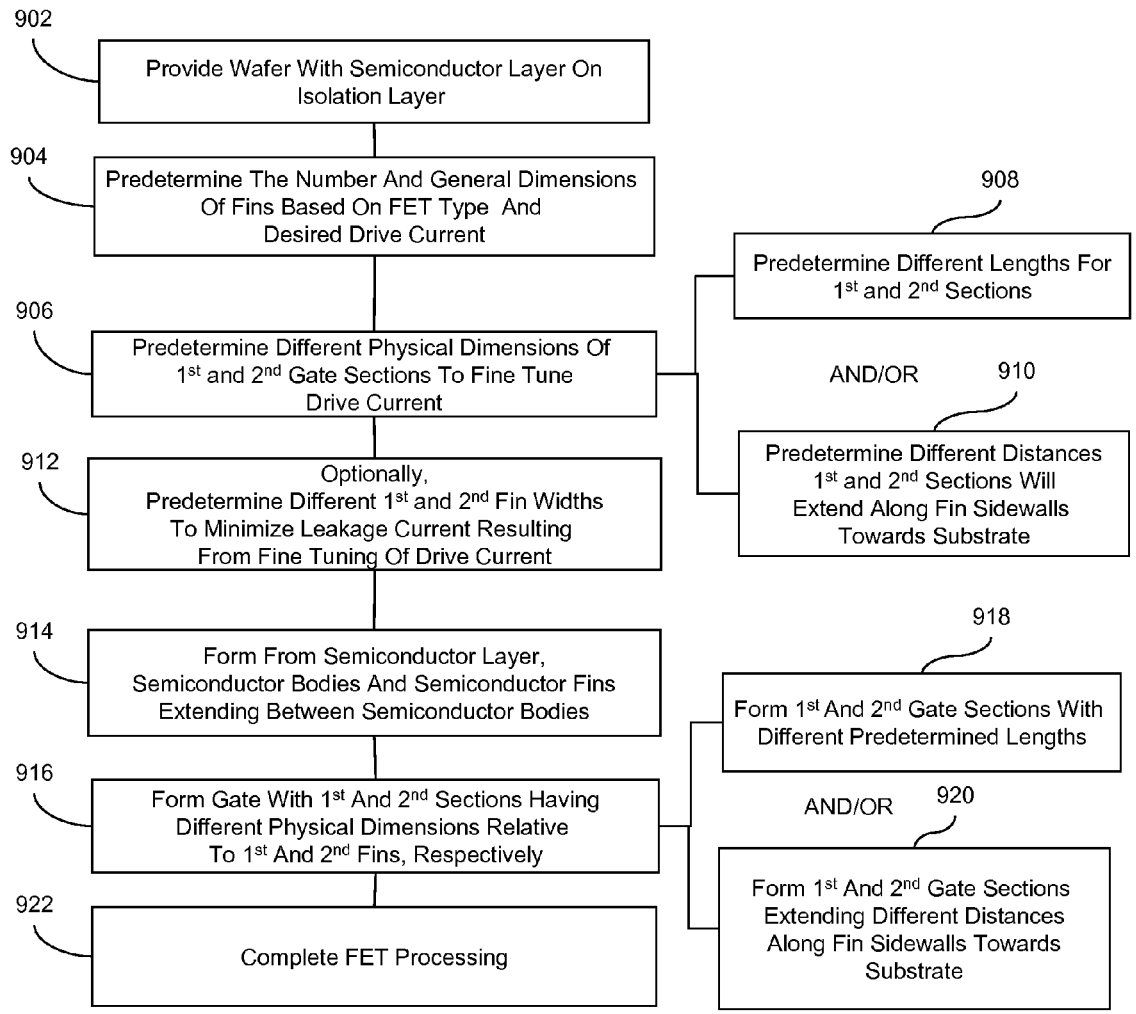
FIG. 9 is a flow diagram illustrating an embodiment of the method of the present invention.
Figure 10:
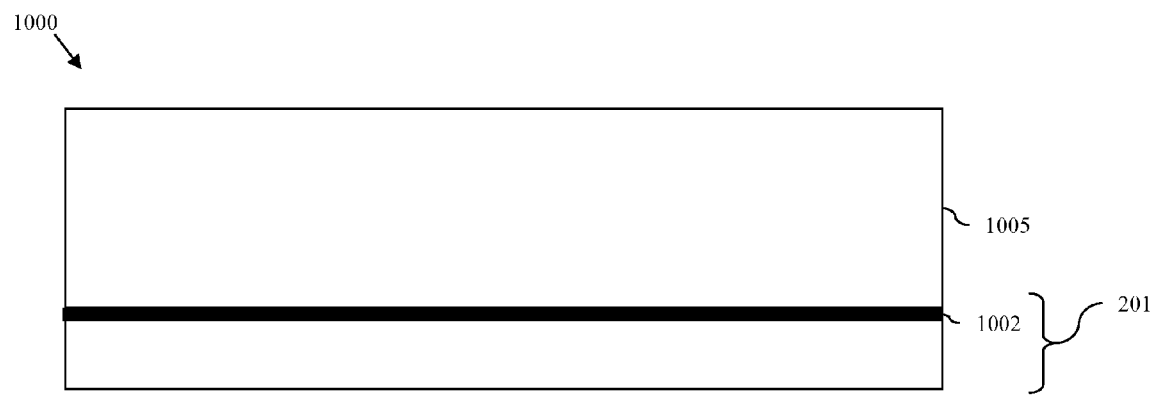
FIG. 10 is a cross-section diagram illustrating a partially completed multi-fin MUGFET formed according to the flow diagram of FIG. 9.

Referring to FIG. 9, method embodiments for forming the field effect transistor structure 200, described above and illustrated in FIGS. 2-8, can comprise first providing a wafer 1000, such as, a silicon-on-insulator (SOI) wafer or a bulk semiconductor wafer (902, see FIG. 10). The wafer 1000 can comprise a substrate 201 and the top surface of the substrate 201 can comprise an isolation layer 1002. For example, the top surface of the substrate 201 can comprise a buried oxide layer of a silicon-on-insulator (SOI) wafer. Alternatively, the top surface of the substrate 201 can comprise a silicon dioxide layer, a doped silicon layer, a silicon germanium layer, etc., on a bulk semiconductor wafer. The wafer 1000 can further comprise a semiconductor layer 1005 on the isolation layer 1002.

Figure 11:
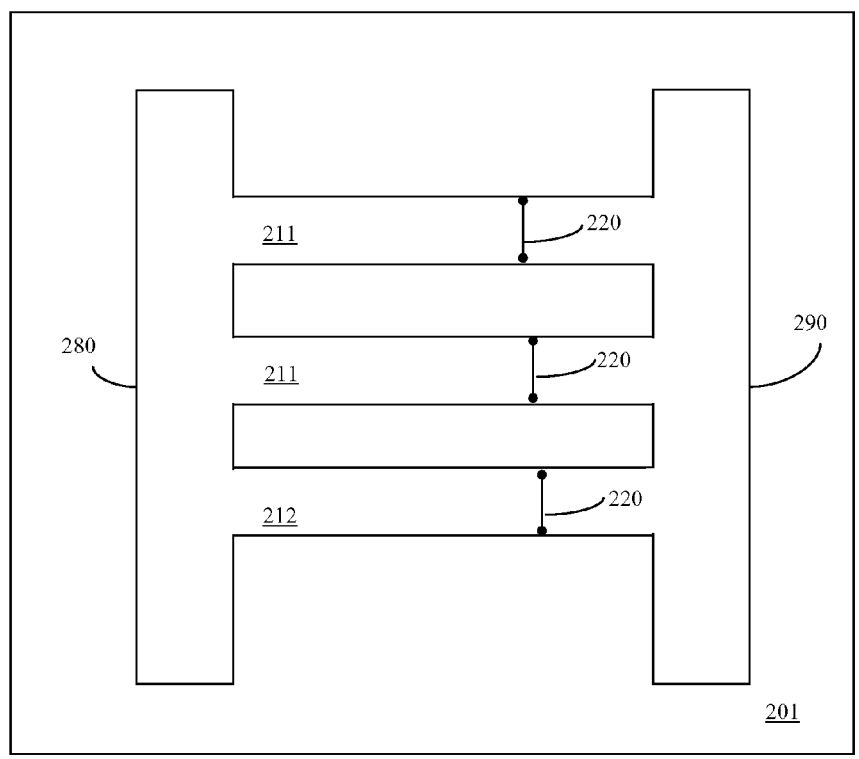
FIG. 11 is a top view diagram illustrating a partially completed multi-fin MUGFET formed according to the flow diagram of FIG. 9.

Using conventional techniques (e.g., lithography or sidewall image transfer techniques), various semiconductor structures can be formed from the semiconductor layer 1005 (914, see FIG. 11). Specifically, the semiconductor layer 1005 can be etched such that semiconductor bodies (designated as source and drain regions 280-290) are formed opposite each other on the substrate 201 and further such that a plurality of semiconductor fins 211-212 extend between the source and drain regions 280-290 (i.e., extend from the source region 280 to the drain region 290). As illustrated, the semiconductor fins 211-212 can be formed such that they are approximately parallel to each other, approximately perpendicular to the source and drain regions 280-290, and with a consistent pitch. Alternatively, the semiconductor fins 211-212 may be formed such that they are angled with respect to each other and/or with respect to the source and drain regions 280-290.

Figure 12:
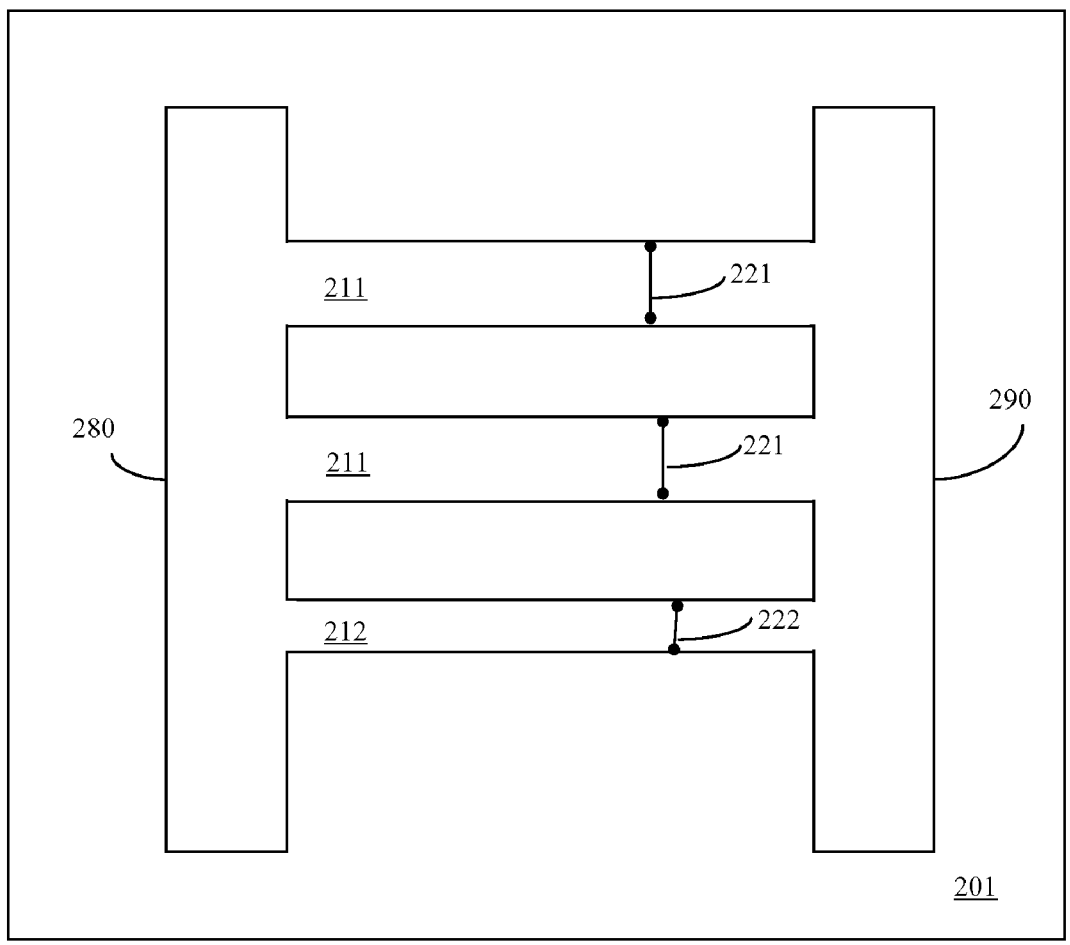
FIG. 12 is a top view diagram illustrating a partially completed multi-fin MUGFET formed according to the flow diagram of FIG. 9.

Prior to forming the semiconductor bodies and semiconductor fins (at process 914), the physical dimensions of the semiconductor fins 211-212 (including the width and height) as well as the number of the semiconductor fins 211-212 can be predetermined (904). Generally, the dimensions of the fins 211-212 are predetermined depending upon whether the field effect transistor 200 being formed is a multi-fin finFET or a multi-fin trigate FET. For example, for a multi-fin trigate FET, the semiconductor fins 211-212 can each have a predetermined height to width ratio that ranges between approximately 3:2 and 2:3. Whereas, for a multi-fin finFET, the semiconductor fins 211-212 can each have a predetermined height to width ratio that is approximately 4:1 or more. Within these ranges, the first and semiconductor fins 211-212 can have approximately equal heights relative to the substrate 201 as well as approximately equal widths 220. However, as discussed in detail below and illustrated in FIG. 12, it may be advantageous to predetermine different first and second widths 221-222 for the first and second semiconductor fins 211-212, respectively.

The number of fins 211-212 can be predetermined based on the desired drive current for the transistor 200. That is, those skilled in the art will recognize that additional fins can be used to provide a greater effective channel width and, thereby, to provide a greater drive current. Each additional semiconductor fin will increase the effective channel width by some incremental value and, thereby, increase the drive current by some incremental value. However, for purposes of this disclosure, the embodiments of the field effect transistor 200 of the present invention are illustrated herein as being formed with three semiconductor fins on the substrate 201 and described herein as being formed with at least one first semiconductor fin 211 (onto which a first gate section 251 will subsequently be formed, discussed below at process 918) and at least one second semiconductor fin 212 adjacent to the first semiconductor fin 211 (onto which a second gate section 252 will subsequently be formed at process 920, discussed below).

After the semiconductor fins 211-212 and designated source and drain regions 280-290 are formed (at process 914), a gate can be formed that traverses all of the semiconductor fins (i.e., the first and second semiconductor fins) and, more specifically, that traverses each fin 211-212 over a designated channel region (916). During gate formation (at process 916), the gate 250 and, thus, the designated channel region in each fin below the gate 250 may be centered between the source and drain regions 280-290. Alternatively, the gate 250 and, thus, the channel region in each fin below the gate 250 may be positioned off-center (e.g., closer to the source region 280 in order to minimize resistance between the source region 280 and gate 250 and further to minimize capacitance between the gate 250 and drain region 290).

Gate formation (at process 916) can comprise forming the gate with a first section on the first top surface and first opposing sidewalls of each first semiconductor fin 211 and with a second section on the second top surface and second opposing sidewalls of the second semiconductor fin 212. However, the gate is formed such that the first and second sections have different physical dimensions and, due to these different physical dimensions, a first surface area of the first top surface and the first opposing sidewalls of each first semiconductor fin covered by the first gate section is different than a second surface area of the second top surface and the second opposing sidewalls of each second semiconductor fin covered by the second gate section. The different physical dimensions of the two sections are predetermined (at process 906), prior to gate formation, in order to tailor the device drive current. That is, they are predetermined in order to make fine adjustments to drive current and, thereby, to achieve a more precisely controlled drive current than was achievable previously, where the drive current adjustment was made by adding or removing entire semiconductor fins.

For example, reducing the physical dimensions of the second section of the gate relative to each second semiconductor fin as compared to the physical dimensions of the first section of the gate relative to each first semiconductor fin can result in an increase in the drive current of the transistor. For example, if the second section 252 is positioned adjacent to only one second semiconductor fin 212 (as illustrated in FIGS. 3-8), the physical dimensions of the second section 252 relative to each second semiconductor fin 212 may be reduced in order to increase the drive current of the transistor 200 by an intermediate value less than the incremental value associated with the addition of a semiconductor fin into the FET structure.

Contrarily, increasing the physical dimensions of the second section 252 of the gate relative to each second semiconductor fin 212 as compared to the physical dimensions of the first section relative to each first semiconductor fin 211 can result in a decrease in the drive current of the transistor. For example, if the second section is positioned adjacent to only one second semiconductor fin 212 (as illustrated in FIGS. 3-8), the physical dimensions of the second section relative to each second semiconductor fin may be increased in order to decrease the drive current of the transistor by an intermediate value less than the incremental value associated with removing a semiconductor fin from the FET structure.

The physical dimensions of the gate sections can differ in a variety of different ways, such as, in length and/or in the distance each gate section extends along the fin sidewalls towards the substrate. More specifically, in one embodiment of the method, first and second lengths of the first and second sections, respectively, can be predetermined in order to achieve a specific drive current (908). For example, the second length can be either shorter than the first length in order to increase drive current or longer than the first length in order to decrease drive current. Then, when the gate is formed (at process 916), the first section can be formed such that it has the predetermined first length and the second section can be formed such that it has the predetermined second length that is different from the predetermined first length (918).

Figure 13:
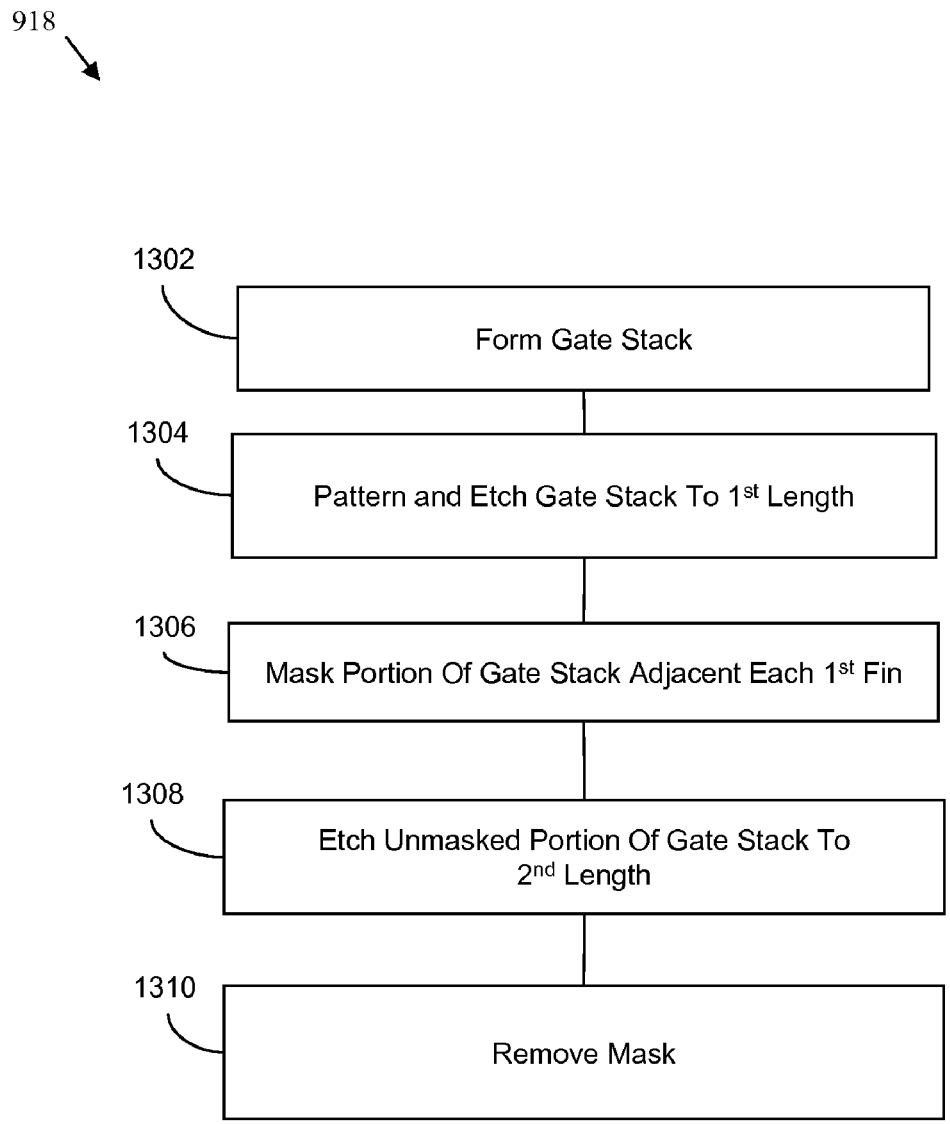
FIG. 13 is a flow diagram detailing exemplary method steps for completely the process 918 of FIG. 9.

For example, referring to FIG. 13, if it is predetermined (at process 908) that the first length should be greater than second length, then the formation of the gate (at process 916) can comprise forming a gate stack over the substrate and semiconductor fins (1302). That is, a thin conformal layer of a gate dielectric material (e.g., a thin silicon dioxide ($SiO_2$) layer or any other suitable gate dielectric layer) can be deposited over the top surface and opposing sidewalls of the semiconductor fins 211-212. Next a blanket gate conductor layer (e.g., a polysilicon layer) can be deposited on the gate dielectric layer.

Figure 14:
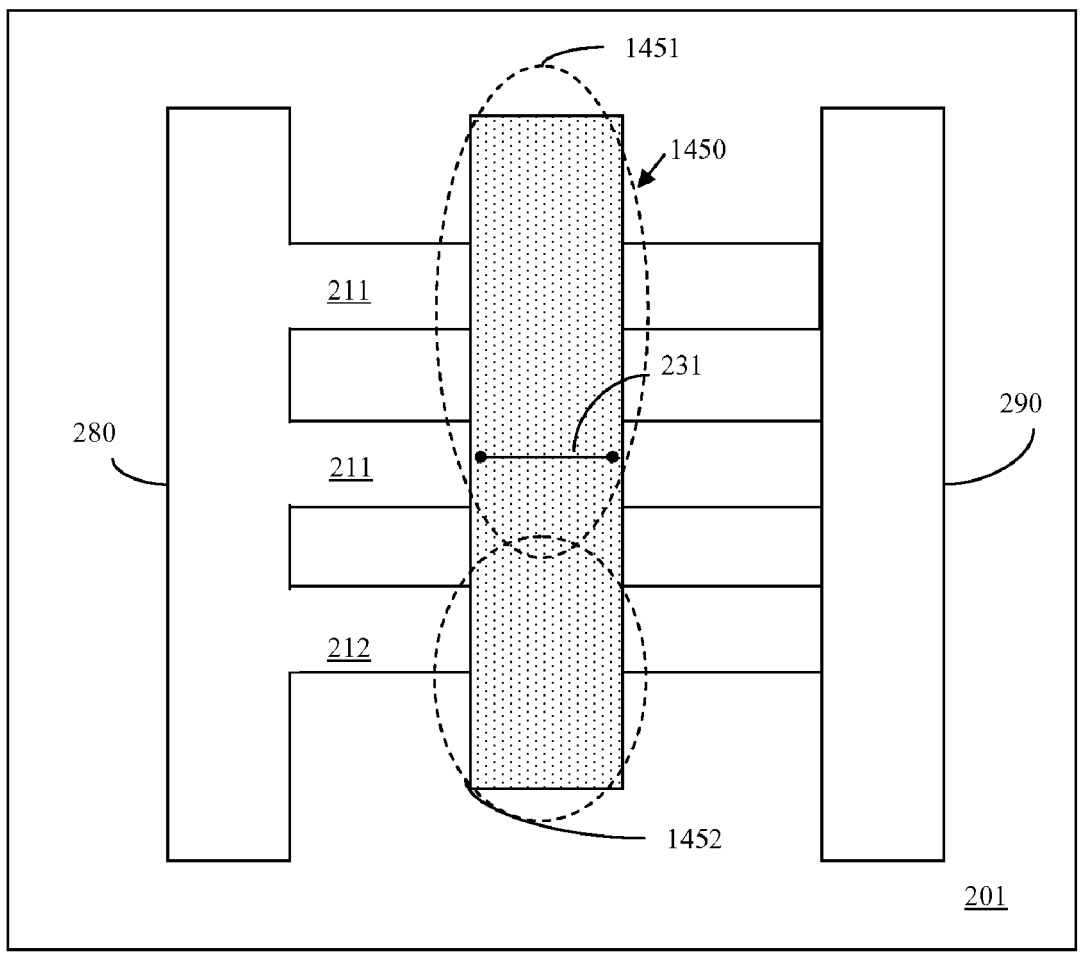
FIG. 14 is a top view diagram illustrating a partially completed multi-fin MUGFET formed according to the flow diagram of FIG. 12.
Figure 15:
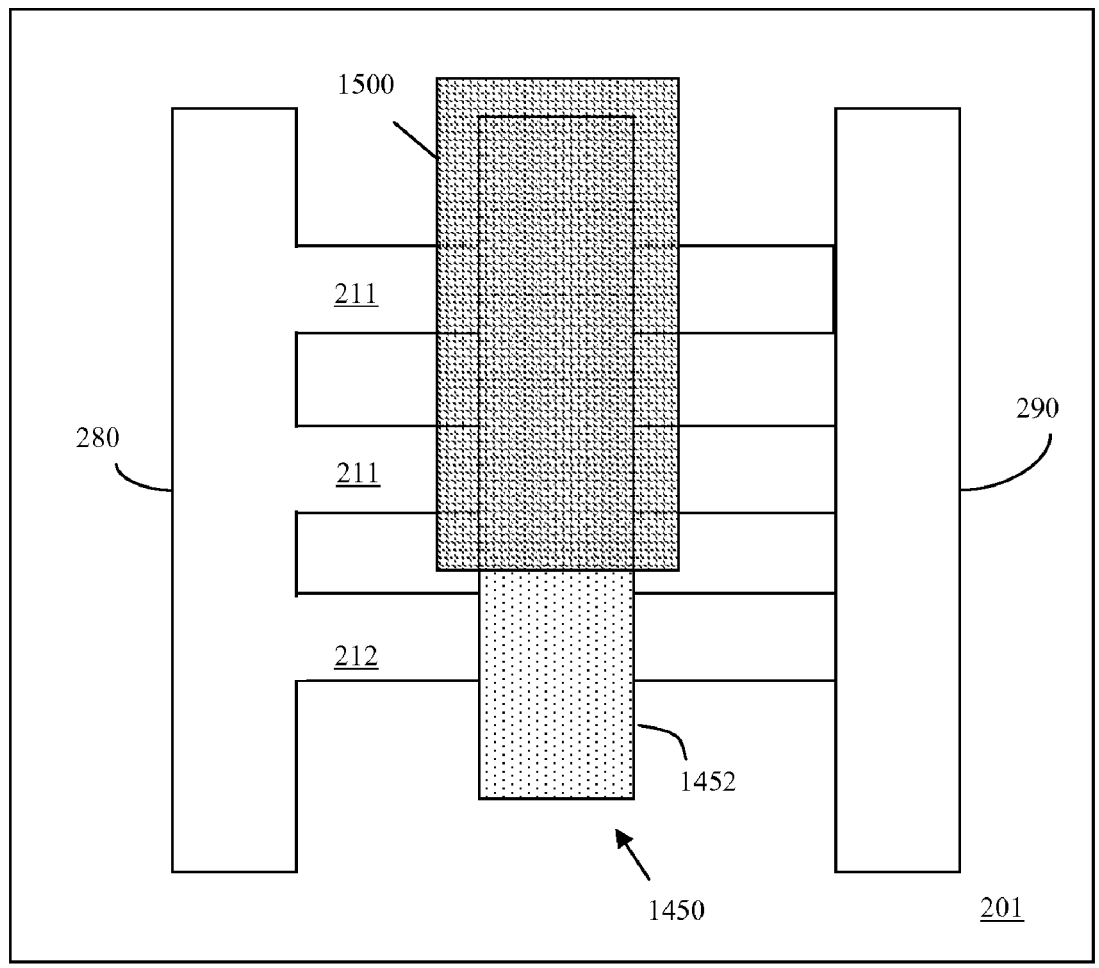
FIG. 15 is a top view diagram illustrating a partially completed multi-fin MUGFET formed according to the flow diagram of FIG. 12.
Figure 16:
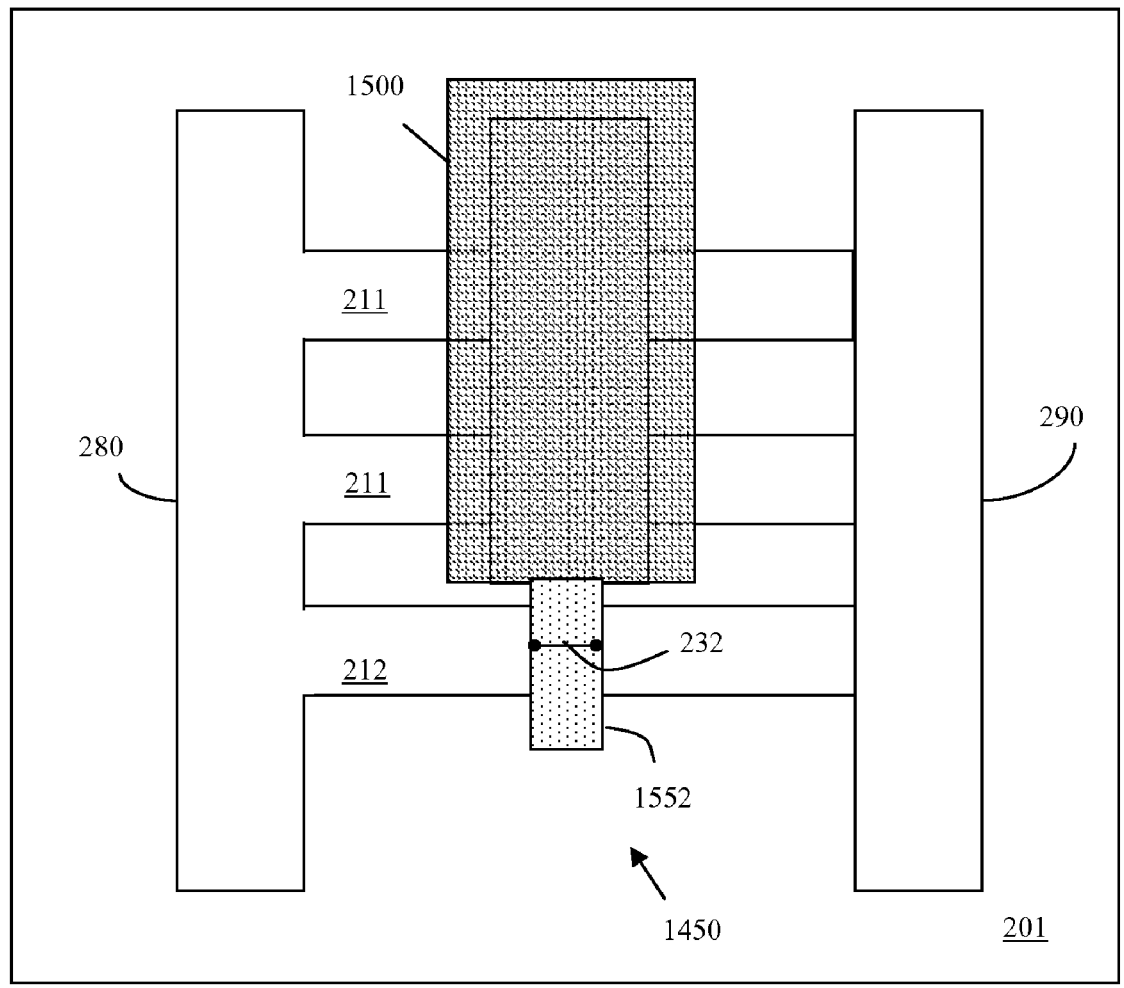
FIG. 16 is a top view diagram illustrating a partially completed multi-fin MUGFET formed according to the flow diagram of FIG. 12.

Conventional lithographic techniques can then be used to pattern and etch the gate stack 1450 such that it has the predetermined first length 231 and traverses each of the semiconductor fins 211-121 (1204, see FIG. 14). Specifically, a first portion 1451 of the gate stack 1450 is formed adjacent the first top surface and first opposing sidewalls of each first semiconductor fin 211 and a second portion 1452 of the gate stack 1450 is formed adjacent the second top surface and second opposing sidewalls of each second semiconductor fin 212. Then, a mask 1500 is formed over a first portion 1451 of the gate stack 1450, which corresponds to the first section of the gate (1306, see FIG. 15). Next, the exposed second portion 1452 of the gate stack, which corresponds to the second section of the gate, can be isotropically etched in order to shrink its size relative to the first portion 1450 below the mask 1500 and, thereby, to achieve the predetermined second length 232 that is less than the predetermined first length (1308, see FIG. 16). Once the first section 251 of the gate 250 is formed with the first length 231 and the second section 252 of the gate 250 is formed with the second length 232, the mask 1500 is removed (1310, see FIG. 3 and detailed description above).

Referring again to FIG. 9, in another embodiment of the method, first and second distances, which the first and second sections of the gate will respectively extend along the opposing sidewalls of the fins towards the substrate, are predetermined in order to achieve a specific drive current (910). For example, the second distance can be either shorter than the first distance in order to increase drive current or longer than the first distance in order to decrease drive current. Then, when the gate is formed (916), the first section can be formed such that it extends along the sidewalls of each first semiconductor fin toward the substrate the predetermined first distance and the second section can be formed such that it extends along the sidewalls of each second semiconductor fin the predetermined second distance that is different from the predetermined first distance (920). In order form such the first and second sections, trench isolation regions (i.e., first and second trench isolation regions) with different predetermined thicknesses (i.e., different first and second thicknesses) can be formed adjacent to the opposing sidewalls of the first and second semiconductor fins, prior to gate formation.

Figure 17:
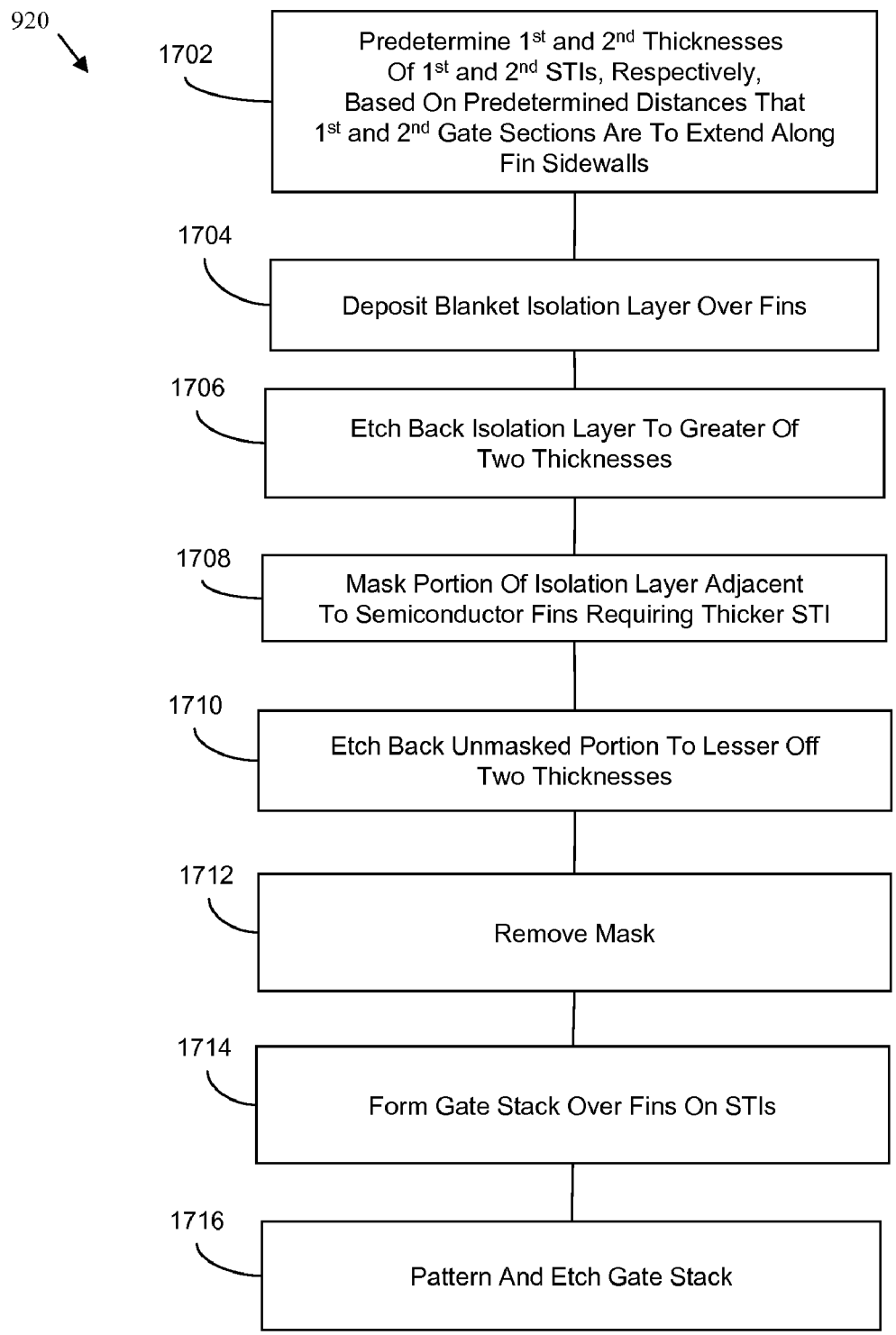
FIG. 17 is a flow diagram detailing exemplary method steps for completely the process 920 of FIG. 9.

Specifically, referring to FIG. 17, if it is determined (at process 910) that the first and second sections should extend different predetermined distances along the fin sidewalls, then prior to forming the gate (at process 1714-1716), first and second isolation regions with different thicknesses can be formed on the substrate adjacent to the first and second semiconductor fins, respectively, in order to compensate for the different distances (1704-1712). More specifically, different thicknesses for first and second isolation regions that will be formed adjacent to the opposing sidewalls of the first and second semiconductor fins are predetermined, prior to forming the gate (1702). These different thicknesses will be predetermined such that the combined height of the first isolation region and the first distance that the first section will extend along the sidewalls of each first semiconductor fin will be approximately equal to the fin height and further such that the combined height of the second isolation region and the second distant that the second section will extend along the sidewalls of each second semiconductor fin will also be approximately equal to the fin height.

Figure 18:
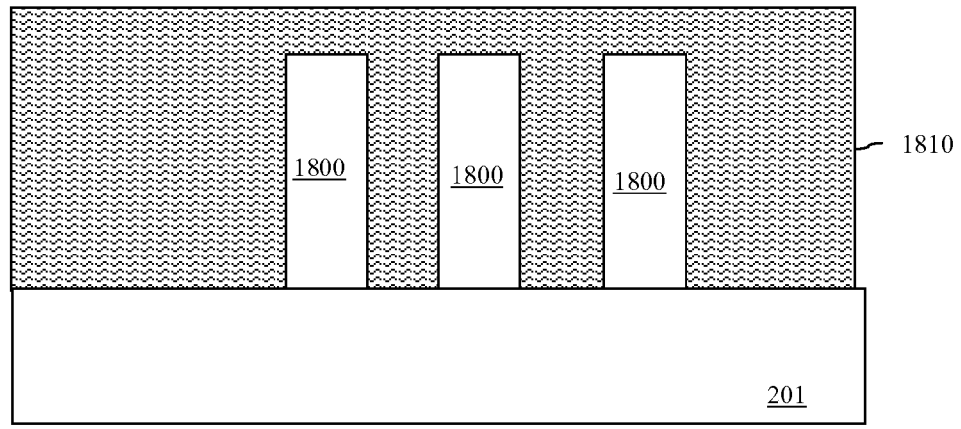
FIG. 18 is a top view diagram illustrating a partially completed multi-fin MUGFET formed according to the flow diagram of FIG. 17.
Figure 19:
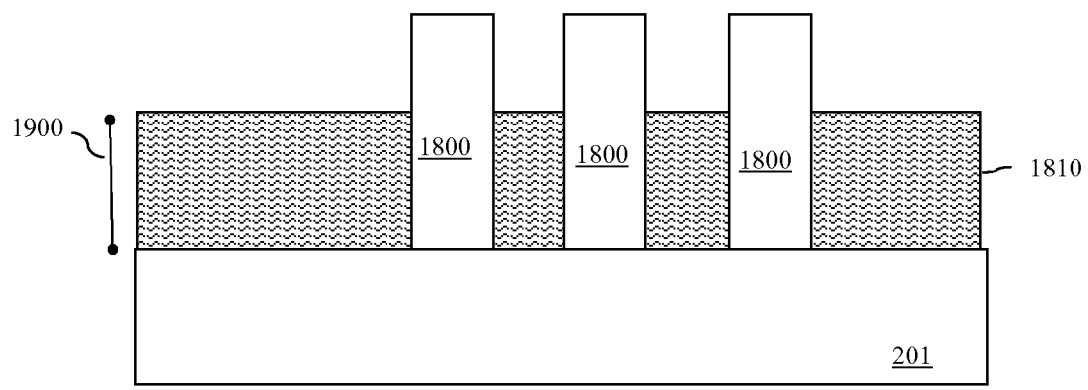
FIG. 19 is a top view diagram illustrating a partially completed multi-fin MUGFET formed according to the flow diagram of FIG. 17.
Figure 20:
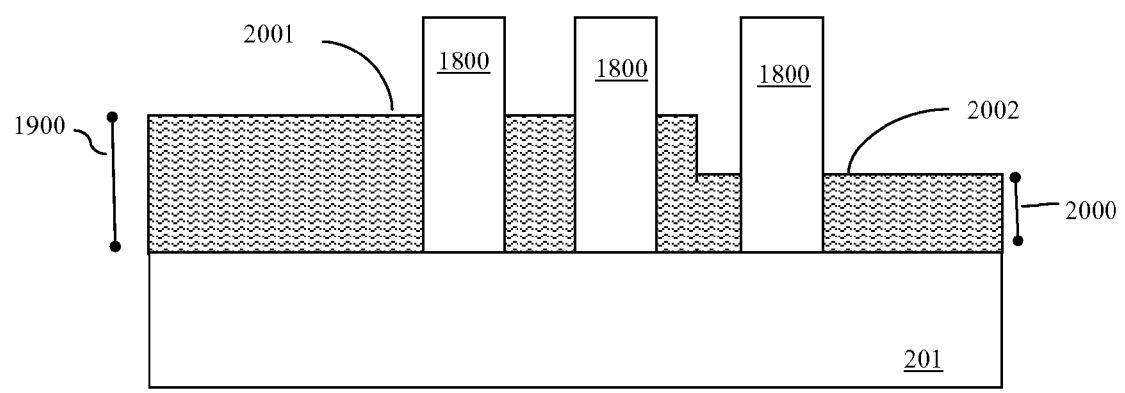
FIG. 20 is a top view diagram illustrating a partially completed multi-fin MUGFET formed according to the flow diagram of FIG. 17.

Isolation regions with different thicknesses can be formed adjacent to the semiconductor fins using known processing techniques. For example, a blanket isolation layer 1810 (e.g., a silicon dioxide (SiO$_2$) layer) can be deposited over multiple fins 1800 (1704, see FIG. 18). The isolation layer 1810 can be etched back to the greater of the two thicknesses 1900 (1706, see FIG. 19). Next, a portion of the isolation layer 1810 adjacent to a selected one or more of the semiconductor fins 1800 can be masked (1708) and the unmasked portion can etched back to the lesser of the two thicknesses 2000 (1710, see FIG. 20). The mask can then be removed (1712). Thus, different isolation regions 2001-2002 are formed with different thicknesses.

Once the isolation regions with different thicknesses are formed, conventional processing techniques can be used to form the gate. A gate stack can be formed over the semiconductor fins above the different isolation regions (1714). That is, a thin conformal layer of a gate dielectric material (e.g., a thin silicon dioxide (SiO$_2$) layer or any other suitable gate dielectric layer) can be deposited over the top surface and opposing sidewalls of all of the semiconductor fins. Next a blanket gate conductor layer (e.g., a polysilicon layer) can be deposited on the gate dielectric layer. Then, conventional lithographic techniques can then be used to pattern and etch the gate stack (1716).

Consequently, if at process 910 of FIG. 9 the first distance is predetermined to be greater than the second distance, then at process 1702 of FIG. 17 the first thickness of the first trench isolation region will necessarily be predetermined to be less than the second thickness of the second trench isolation region. Then, according to the method steps 1704-1712 of FIG. 17 discussed above, the first trench isolation region with the predetermined first thickness will formed on the substrate adjacent to the first opposing sidewalls of each first semiconductor fin and the second trench isolation region with the greater predetermined second thickness will be formed on the substrate adjacent to the second opposing sidewalls of each second semiconductor fin. Once the isolation regions with different thicknesses are formed, a gate is formed according to the method steps 1712-1714 of FIG. 17. The resulting structure, as illustrated in FIG. 5, is a transistor with a gate 250 adjacent to the semiconductor fins 211-212 above the first isolation region 261 with the first thickness 241 and above the second trench isolation region 262 with the greater second thickness 242. Due to the different thicknesses 241-242 of the isolation regions 261-262, the gate 250 will be formed with a first section 251 that extends a first distance 271 along the sidewalls of each first semiconductor fin 211 towards the substrate 201 and a second section 252 that extends a lesser second distance 272 along the sidewalls of each second semiconductor fin 212 towards the substrate 201 (i.e., the second distance 272).

Contrarily, if at process 910 of FIG. 9 the second distance is predetermined to be greater than the first distance, then at process 1702 of FIG. 17 the first thickness of the first trench isolation region will necessarily be predetermined to be greater than the second thickness of the second trench isolation region. Then, according to the method steps 1704-1712 of FIG. 17 discussed above, the first trench isolation region with the predetermined first thickness will formed on the substrate adjacent to the first opposing sidewalls of each first semiconductor fin and the second trench isolation region with the lesser predetermined second thickness will be formed on the substrate adjacent to the second opposing sidewalls of each second semiconductor fin. Once the isolation regions with different thicknesses are formed, a gate is formed according to the method steps 1712-1714 of FIG. 17. The resulting structure, as illustrated in FIG. 6 is a transistor with a gate 250 adjacent to the semiconductor fins 211-212 above the first isolation region 261 with the first thickness 241 and above the second trench isolation region 262 with the lesser second thickness 242. Due to the different thicknesses 241-242 of the isolation regions 261-262, the gate 250 will be formed with a first section 251 that extends a first distance 271 along the sidewalls of each first semiconductor fin 211 towards the substrate 201 and a second section 252 that extends a greater second distance 272 along the sidewalls of each second semiconductor fin 212 towards the substrate 201 (i.e., the second distance 272).

In yet another embodiment of the method, both different lengths (i.e., the first and second lengths, as defined above) and different distances (i.e., the first and second distances, as defined above) can be predetermined at process 908 and at process 910 of FIG. 9 in order to achieve a specific drive current. Then, processes 918 and 920, as discussed above, can be combined in order to form the first and section sections of the gate with the different predetermined physical dimensions.

Those skilled in the art will recognize that the drive current and leakage current of a field effect transistor are interdependent. That is, an increase in drive current will typically result in a corresponding increase in leakage current. Consequently, if the physical dimensions of the second section are to be reduced relative to each second semiconductor fin as compared to the physical dimensions of the first section relative to each first semiconductor fin in order increase drive current, then additional processing steps can be incorporated into the method of FIG. 9 in order to minimize (i.e., limit or avoid altogether) any corresponding increase in leakage current.

For example, as discussed above, the general physical dimensions of the first and second semiconductor fins 211-212 can be predetermined at process 904 of FIG. 9, depending upon the type of multi-fin MUGFET being formed. However, to compensate for any smaller physical dimensions of the second section of the gate as predetermined at process 906, the predetermined width 222 of each second semiconductor fin 212 can be reduced relative to the predetermined width 221 of each first semiconductor fin 211 (912, see FIG. 12) and the FET processing can continue so as to form the semiconductor fins and gate with the predetermined dimensions (914-920, see FIGS. 7-8)

Following gate formation at process 916, additional well-known processing steps may be performed to complete the multi-fin MUGFET structure. The additional processing steps may include, but not limited to, halo implantation, spacer formation, source/drain extension implantation, source/drain implantation, silicide formation, deposition and planarization of a dielectric layer, contact formation, etc. (922).

Therefore, disclosed above are embodiments of an improved multi-gated field effect transistor (MUGFET) structure and method of forming the MUGFET structure so that it exhibits a more tailored drive current. Specifically, the MUGFET incorporates multiple semiconductor fins in order to increase effective channel width of the device and, thereby, to increase the drive current of the device. Additionally, the MUGFET incorporates a gate structure having different sections with different physical dimensions relative to the semiconductor fins in order to more finely tune device drive current (i.e., to achieve a specific drive current). Optionally, the MUGFET also incorporates semiconductor fins with differing widths in order to minimize leakage current caused by increases in drive current. The disclosed technique provides a low cost and flexible approach to modifying the drive current of a MUGFET Benefits which flow from this invention include reduced manufacturing costs, due to the simplicity of the methods employed and reduced power consumption and die size, due to elimination of the need to use large numbers of fins in current-balanced circuits. Finer tuning of critical circuits via this invention can furthermore result in improved yield and manufacturing tolerances, as well as improved circuit performance.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention, described above, can be practiced with modification within the spirit and scope of the appended claims.

What is claimed is:

1. A single field effect transistor comprising:
a substrate;
a first semiconductor fin on said substrate, said first semiconductor fin having a first width, a first top surface and first opposing sidewalls;
a second semiconductor fin on said substrate adjacent to said first semiconductor fin, said second semiconductor fin having a second width, a second top surface and second opposing sidewalls; and
a gate traversing said first semiconductor fin and said second semiconductor fin, said gate comprising:
a first section on said first top surface and on said first opposing sidewalls, said first section having a first gate length as measured parallel to said substrate and perpendicular to said first width of said first semiconductor fin; and
a second section on said second top surface and on said second opposing sidewalls, said second section having a second gate length as measured parallel to said substrate and perpendicular to said second width of said second semiconductor fin, said second gate length being different from said first gate length.

2. The field effect transistor of claim 1, said first gate length and said second gate length being predetermined to achieve a specific drive current.

3. The field effect transistor of claim 1, said first width of said first semiconductor fin and said second width of said second semiconductor fin width being different.

4. The field effect transistor of claim 1,
said first gate length being greater than said second gate length,
said first section of said gate further extending vertically along said first opposing sidewalls a first distance from said first top surface towards said substrate,
said second section of said gate further extending vertically along said second opposing sidewalls a second distance from said second top surface towards substrate, and
said second distance being less than said first distance.

5. The field effect transistor of claim 4, further comprising:
a first trench isolation region adjacent said first opposing sidewalls, between said substrate and said first section, and having a first thickness; and
a second trench isolation region adjacent said second opposing sidewalls, between said substrate and said second section, and having a second thickness, said second thickness being greater than said first thickness such that said second distance is less than said first distance.

6. The field effect transistor of claim 1, said first semiconductor fin being approximately parallel to said second semiconductor fin.

7. The field effect transistor of claim 1, said first semiconductor fin and said second semiconductor fin having approximately equal heights relative to said substrate.

8. The field effect transistor of claim 1, further comprising:
a source region on said substrate; and
a drain region on said substrate opposite said source region, said first semiconductor fin and said second semiconductor fin each extending laterally from said source region to said drain region.

9. A single field effect transistor comprising:
a substrate;
a plurality of first semiconductor fins on said substrate, each first semiconductor fin having a first width, a first top surface and first opposing sidewalls;
at least one second semiconductor fin on said substrate adjacent and parallel to one of said first semiconductor fins, said second semiconductor fin having a second width, a second top surface and second opposing sidewalls; and
a gate traversing each of said first semiconductor fins and said second semiconductor fin, said gate comprising:
a first section on said first top surface and on said first opposing sidewalls of each of said first semiconductor fins, said first section having a first gate length as measured parallel to said substrate and perpendicular to said first width of said first semiconductor fin; and a second section on said second top surface and said second opposing sidewalls, said second section having a second gate length as measured parallel to said substrate and perpendicular to said second width of said second semiconductor fin, said second gate length being different from said first gate length.

10. The field effect transistor of claim 9, said first gate length and said second gate length being predetermined to achieve a specific drive current.

11. The field effect transistor of claim 9, said second width of said second semiconductor fin being different from said first width of each of said first semiconductor fins so as to minimize leakage current.

12. The field effect transistor of claim 9,
said first gate length being greater than said second gate length,
said first section further extending vertically along said first opposing sidewalls a first distance from said first top surface towards said substrate,
said second section further extending vertically along said second opposing sidewalls a second distance from said second top surface towards substrate, and
said second distance being different from said first distance.

13. The field effect transistor of claim 12, further comprising:
first trench isolation regions adjacent said first opposing sidewalls, between said substrate and said first section, and having a first thickness; and
a second trench isolation region adjacent said second opposing sidewalls, between said substrate and said second section, and having a second thickness, said second thickness being greater than said first thickness such that said second distance is less than said first distance.

14. The field effect transistor of claim 9, said first semiconductor fins and said second semiconductor fin being approximately parallel.

15. The field effect transistor of claim 9, said first semiconductor fins and said second semiconductor fin having approximately equal heights relative to said substrate.

16. The field effect transistor of claim 9, further comprising:
a source region above said substrate; and
a drain region above said substrate opposite said source region, said first semiconductor fins and said second semiconductor fin each extending laterally from said source region to said drain region.

17. A field effect transistor comprising:
a substrate;
at least one first semiconductor fin on said substrate, said first semiconductor fin having a first top surface, first opposing sidewalls, and a first width;
a second semiconductor fin on said substrate adjacent to said first semiconductor fin, said second semiconductor fin having a second top surface, second opposing sidewalls and a second width that is less than said first width, said first width and said second width being predetermined to minimize leakage current; and
a gate traversing said first semiconductor fin and said second semiconductor fin, said gate comprising:
a first section on said first top surface and extending vertically along said first opposing sidewalls a first distance from said first top surface towards said substrate, said first section having a first gate length as measured parallel to said substrate and perpendicular to said first width of said first semiconductor fin; and
a second section on said second top surface and extending vertically along said second opposing sidewalls a second distance from said second top surface towards substrate, second distance being less than said first distance, said second section further having a second gate length as measured parallel to said substrate and perpendicular to said second width of said second semiconductor fin, said second gate length being less than said first gate length, and
said first gate length, said second gate length, said first distance and said second distance each being predetermined to achieve a specific drive current.

18. The field effect transistor of claim 17, further comprising:
a first trench isolation region adjacent said first opposing sidewalls, between said substrate and said first section, and having a first thickness; and
a second trench isolation region adjacent said second opposing sidewalls, between said substrate and said second section, and having a second thickness, said second thickness being greater than said first thickness such that said second distance is less than said first distance.

19. The field effect transistor of claim 17, said first semiconductor fin being approximately parallel to said second semiconductor fin.

20. The field effect transistor of claim 17, said first semiconductor fin and said second semiconductor fin having approximately equal heights relative to said substrate.

* * * * *